(12) United States Patent
Chen et al.

(10) Patent No.: US 9,281,027 B1
(45) Date of Patent: Mar. 8, 2016

(54) TEST TECHNIQUES IN MEMORY DEVICES

(71) Applicant: ARM LIMITED, Cambridge (GB)

(72) Inventors: Andy Wangkun Chen, Austin, TX (US);
Yew Keong Chong, Austin, TX (US);
Sriram Thyagarajan, Austin, TX (US);
Mudit Bhargava, Austin, TX (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 14/511,581

(22) Filed: Oct. 10, 2014

(51) Int. Cl.
*G11C 7/00* (2006.01)
*G11C 7/10* (2006.01)

(52) U.S. Cl.
CPC .............. *G11C 7/106* (2013.01); *G11C 7/1048* (2013.01)

(58) Field of Classification Search
CPC ................................... G11C 7/00; G11C 29/00
USPC ................................ 365/201, 189.011–225.7
See application file for complete search history.

(56) References Cited

U.S. PATENT DOCUMENTS

| | | | | |
|---|---|---|---|---|
| 6,791,890 B2 * | 9/2004 | Ooishi | ................... | G11C 7/062 365/189.07 |
| 2003/0103395 A1 * | 6/2003 | Ooishi | ................... | G11C 7/062 365/201 |
| 2007/0280017 A1 * | 12/2007 | Shibata | .............. | G11C 11/5628 365/201 |

OTHER PUBLICATIONS

O. Hirabayashi et al., "DFT Techniques for Wafer-Level At-Speed Testing of High-Speed SRAMs", Semiconductor Company, Toshiba Corporation, ITC International Test Conference, 2002 IEEE, pp. 164-169 (6 pages).

* cited by examiner

*Primary Examiner* — Harry W Byrne
(74) *Attorney, Agent, or Firm* — Pramudji Law Group PLLC; Ari Pramudji

(57) ABSTRACT

A memory device includes latching circuitry for receiving a latching value and for providing said latching value as an output. A path receives said latching value and passes said latching value to said latching circuitry. First storage circuitry provides a first stored value when said memory device is in a read mode of operation. A bit line is connected to said first storage circuitry. First control circuitry selectively connects said bit line to said path. Sensing circuitry, when an enable signal is active, detects a voltage change on said path as a result of connecting said bit line to said first storage circuitry and said path, and outputs a latching value, dependent on said voltage change, on said path. Second storage circuitry provides a second stored value in a test mode of operation and second control circuitry receives said second stored value and selectively outputs said second stored value as said latching value on said path. Said latching circuitry outputs said latching value as said output in dependence on said enable signal, such that said enable signal controls both said latching circuitry and said sense circuitry.

18 Claims, 14 Drawing Sheets

TEST TECHNIQUES IN MEMORY DEVICES

BACKGROUND

1. Technical Field

The present disclosure relates to the field of memory devices. More particularly, it relates to a memory device supporting test techniques such as Design For Test (DFT) and write-through modes.

2. Background

It is known for a memory device to be configured to operate, as well as in a regular read or write mode, in a test mode in which test techniques such as DFT are used to test that circuitry operates as intended. One way in which such techniques can be used is to provide a particular, known set of values to peripheral logic and then to collect the output. The output can then be tested against some expected values to ensure that the peripheral logic worked as expected.

In using DFT techniques, it is important that in a test mode of operation, the system operates in a similar way to how it would in a normal mode of operation. If this is not the case, then doubt may be cast on the reliability of the results of applying DFT techniques.

Note that the term "test mode" is intended to cover both a "DFT mode" and any supported "write-through mode" that involves both writing data to memory and providing that data as an output.

SUMMARY

According to one aspect there is provided a memory device comprising: latching circuitry to receive a latching value and to provide said latching value as an output; a path to receive said latching value and to pass said latching value to said latching circuitry; first storage circuitry to provide a first stored value when said memory device is in a read mode of operation; a bit line connected to said first storage circuitry; first control circuitry to selectively connect said bit line to said path; sensing circuitry to, when an enable signal is active, detect a voltage change on said path as a result of connecting said bit line to said first storage circuitry and said path, and to output said latching value on said path, wherein said latching value is dependent on said voltage change; second storage circuitry to provide a second stored value when said memory device is in a test mode of operation; and second control circuitry to receive said second stored value and to selectively output said second stored value as said latching value on said path, wherein said latching circuitry is to output said latching value as said output in dependence on said enable signal, such that said enable signal controls both said latching circuitry and said sense circuitry.

In accordance with a second aspect, there is provided a method of operating a memory device having a read mode of operation and a test mode of operation, said method comprising the steps: in said read mode of operation: providing a first stored value to a bit line; and when said bit line has been selectively connected to a path, in response to an enable signal, detecting a voltage change on said path and outputting a latching value on said path, wherein said latching value is dependent on said voltage change; in said test mode of operation: providing a second stored value; and selectively outputting said second stored value as said latching value on said path; in both modes of operation: outputting said latching value as an output in dependence on said enable signal, such that said enable signal controls both said step of detecting a voltage change on said path and said step of outputting said latching value as an output.

In accordance with a third aspect, there is provided a memory device comprising: latching means for receiving a latching value and for providing said latching value as an output; path means for receiving said latching value and for passing said latching value to said latching means; first storage means for providing a first stored value when said memory device is in a read mode of operation; bit line means for connecting to said first storage means; first control means for selectively connecting said bit line to said path means; sense means for, when an enable signal is active, detecting a voltage change on said path means as a result of connecting said bit line means to said first storage means and said path and for outputting a voltage on said path to said latching value, wherein said latching value is dependent on said voltage change; second storage means for providing a second stored value when said memory device is in a test mode of operation; and second control means for receiving said second stored value and for selectively outputting said second stored value as said latching means on said path means, wherein said latching means is for outputting said latching value as said output in dependence on said enable signal, such that said enable signal controls both said latching circuitry and said sense circuitry.

BRIEF DESCRIPTION OF THE DRAWINGS

The present invention will be described further, by way of example only, with reference to embodiments thereof as illustrated in the accompanying drawings, in which.

DESCRIPTION OF EXAMPLE EMBODIMENTS

Figure 1:
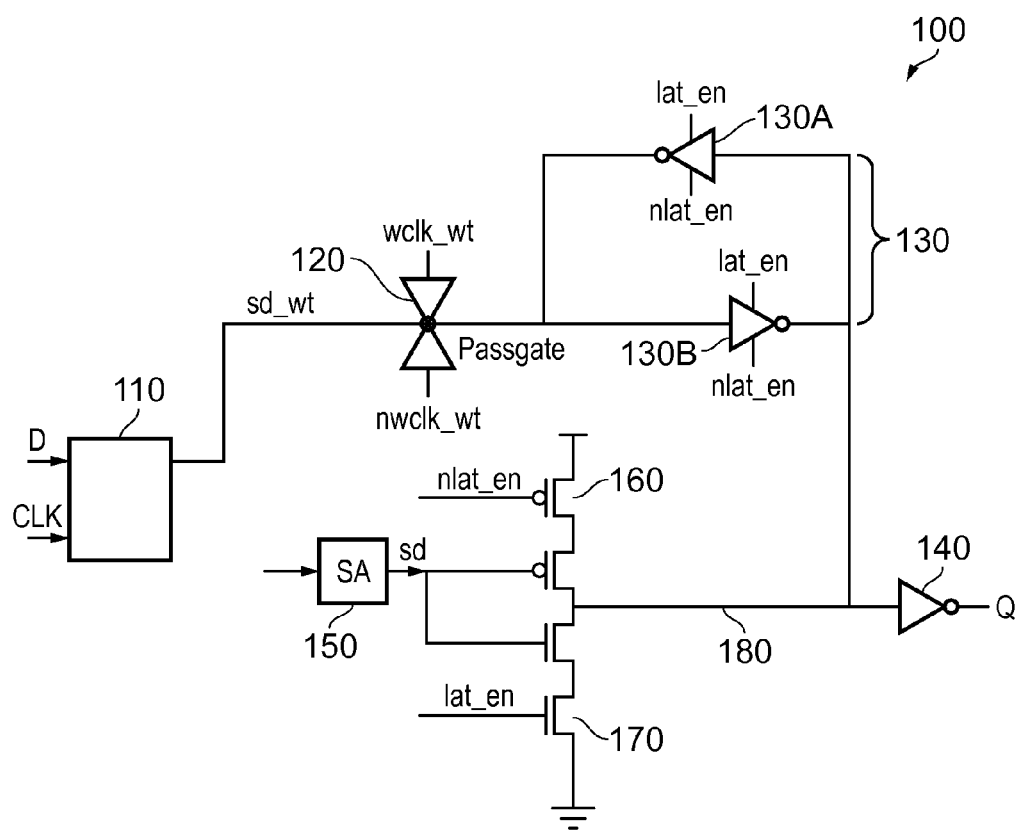
FIG. 1 illustrates a previously proposed memory device supporting DFT techniques.

Before discussing the embodiments with reference to the accompanying figures, the following description of embodiments and associated advantages is provided.

In accordance with the first aspect, in a read mode of operation, data is provided by the first storage circuitry to a bit line. A path is then selectively connected (via the first control circuitry) to the bit line such that the path receives a latching value from the bit line. Accordingly, the voltage of the path may be affected. When an enable signal is active, any such voltage change is detected. The sense circuitry may then output the latching value on the path, which is then latched by the latching circuitry and output. For example, the sense circuitry may drive the path to a voltage that corresponds to the latching value.

During a test mode of operation, data is provided by the second storage circuitry. The second control circuitry receives the second stored value and outputs the second stored value as the latching value on the path, which is then latched by the latching circuitry and output.

In either case therefore, the latching value is received from the same shared path by a latching circuit. The latching circuit also outputs the latching value as the output (to Q) in dependence on the same enable signal used to activate the sense circuitry. Advantageously, therefore, both test data and a real data (from the first storage circuitry and the second storage circuitry respectively) are output in dependence on the same enable signal, regardless of whether the memory device is in a read mode of operation or a test mode of operation. Additionally, much of the same circuitry is used for outputting a value, regardless of whether the device operates in a read mode of operation or a test mode of operation. In particular, the path that passes the latching value to the latching circuitry is used in both modes of operation. During a test mode of operation, the bit line may remain pre-charged. This does not disrupt the data provided from the second storage circuitry, since the first control circuitry may keep the bit line separate from the path.

As consequence, the timing of providing the output value (for example characterised as the clock-to-output (CLK2Q) time of the device) is then very similar, whether operating in read or test mode. More accurate testing of peripheral logic can thus be carried out and furthermore the de-access time of the device (the time from CLK to the removal of a value from a previous cycle at the output) can be increased without degrading performance. Moreover, the de-access time can be more closely matched to the access time.

The memory device may be capable of toggling the enable signal in the test mode of operation. Since the enable signal controls the sense circuitry, this signal would previously have been held in an inactive state during the test mode of operation. However, configuring the memory device to toggle the enable signal in the test mode of operation enables a greater variety of testing to be carried out in the test mode of operation.

The control circuitry may selectively output said second stored value when said memory device is in said test mode of operation. Consequently, during a test mode of operation, the flow of data from the second storage circuitry to the path can be controlled.

The first control circuitry may be a bit line read multiplexer (mux). In this way, multiple bitlines may be connected to the same path. Additionally, the bit line read multiplexer can separate the bit line from the path and thereby make it possible to keep the bit line precharged while the memory device is in a test mode of operation.

The second control circuitry may be implemented in a number of different ways. However, in some embodiments, the second control circuitry is embodied by the use of a transistor. The use of a transistor means that it is possible for the path to acquire the second stored value with a small amount of additional circuitry, supporting a compact overall layout of the memory device. In some embodiments, an n-type transistor such as an NMOS may be used. This can result in a more compact control circuitry than if, for example, a p-type transistor was used.

The first storage circuitry may be a bit cell. For example, it may be a 6T SRAM bitcell.

The second storage circuitry may be a latch. It may also be any other kind of data storage element, such as a flip-flop and so on.

The second storage circuitry may be configured to receive a data value, a scan input value and a scan signal; and said second storage circuitry may be configured to select between said data value and said scan input value for outputting as said second stored value, based on a value of said scan signal. Such embodiments can be used to implement a scan chain in which a number of components in the memory device are chained together. When a scan signal is asserted, a series of bits can be inserted through the chain such that each component receives a particular bit value as an input value. The scan signal can then be de-asserted and normal operation initiated so that each component in the memory device then commences operation using that input value.

The latching circuitry may be configured to output the latching value when the enable signal is active. Accordingly, the enable signal can directly control when the latching value is output by the latching circuitry and moreover this control occurs for both the read mode of operation and the test mode of operation. Accordingly, the same signal that causes the sense circuitry to be active causes the latching value to be output by the latching circuitry and more particularly the delay to outputting the output value depends on the same enable signal in both the test and read mode, ensuring that the specific delay for each mode are very close to one another.

In some embodiments, the clock-to-output time in said test mode of operation is within 10% of said clock-to-output time in a read mode of operation. In some embodiments, the clock-to-output time in said test mode of operation is within 5% of said clock-to-output time in a read mode of operation. In some embodiments, the clock-to-output time in said test mode of operation is within 1.5% of said clock-to-output time in a read mode of operation. Consequently, the reliability of test techniques can be improved compared to previously proposed techniques where there can be a substantial difference between the clock-to-output time under a test mode of operation and a read mode of operation.

The memory device may comprise path precharging circuitry to precharge said path when enabled, wherein said sensing circuitry detects a voltage change on said path when said path is precharged and when said path precharging circuitry is disabled.

In some embodiments, the path may comprise a dynamic node having an evaluation mode and a precharge mode.

Particular embodiments will now be described with reference to the figures.

FIG. 1 illustrates a previously proposed circuit diagram forming part of a memory device 100. The circuit comprises a DFT latch 110, which receives a data value D and a clock signal CLK as inputs.

In a test mode of operation (which, throughout this description, we use to encompass both a "DFT mode" and a "write through mode" if the associated memory device supports a write-through mode), the DFT latch outputs the data value D in dependence on the clock signal CLK. In this embodiment, at the rising edge of the clock signal, the DFT latch outputs the data value D as the value sd_wt. The data value sd_wt is received at passgate 120. The passgate 120 is driven by wclk_wt. Accordingly, the data value sd_wt passes through the passgate 120 in dependence on the signal wclk_wt. Note that in this embodiment, the signal wclk_wt is a derivative of the clock signal CLK and a control signal which is active in the test mode but not in the read mode. The data value sd_wt that is output by the passgate 120 passes to latch 130. Latch 130 comprises inverters 130A and 130B. Each of these inverters is clocked by a latch enable signal lat_en. A data value output from the latch 130 is inverted by an inverter 140 before being provided as the output value Q.

In a read mode of operation, a data value sd is output by the sense amplifier circuitry 150 as a result of reading a storage device such as a bit cell. The value of sd is provided to the inverter 140 gated by the latch enable signal lat_en. In particular, the latch enable signal lat_en and its complement nlat_en activate PMOS transistor 160 and NMOS transistor 170 so that section 180 is pulled up to VDD or pulled down to ground depending on the value of sd. As in the test mode of operation, the inverter 140 inverts the value at section 180 and provides the result as the output Q.

Accordingly, in a test mode of operation a value is provided at Q based on the timing of wclk_wt whereas in a read mode of operation a value is provided at Q based on the timing of the sense enable signal that controls the sense amplifier 150. It has been found that the delay between the assertion of the wclk_wt signal and a data value being provided at Q can be much smaller than the delay between the assertion of the sense enable signal and a data value being provided at Q. In other words, the output delay CLK2Q can be much larger when the memory device is in a read mode of operation than when the memory device is in a test mode of operation. Consequently, doubt can be cast on the reliability of using DFT techniques because the behaviour of the memory device 100 is different in a test mode of operation than it is in a read mode of operation.

Figure 2A:
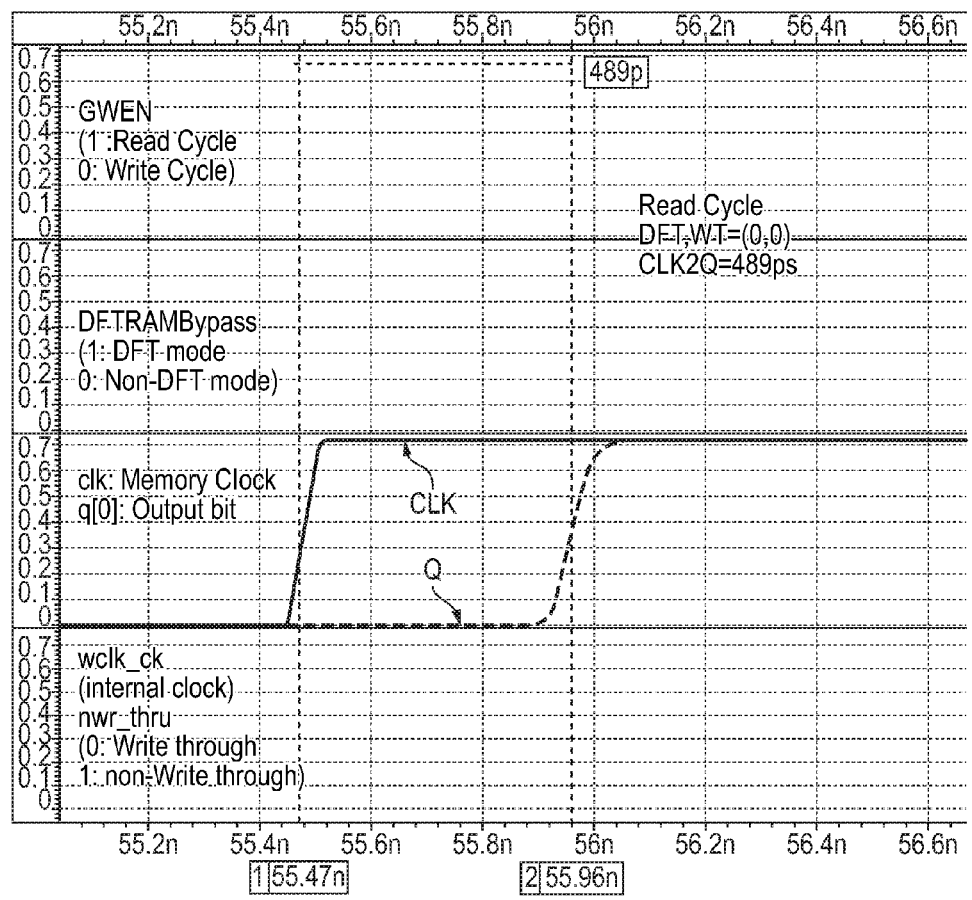
FIGS. 2A-D illustrate simulated timing diagrams showing example timings of various signals in the circuit shown in FIG. 1.
Figure 2B:
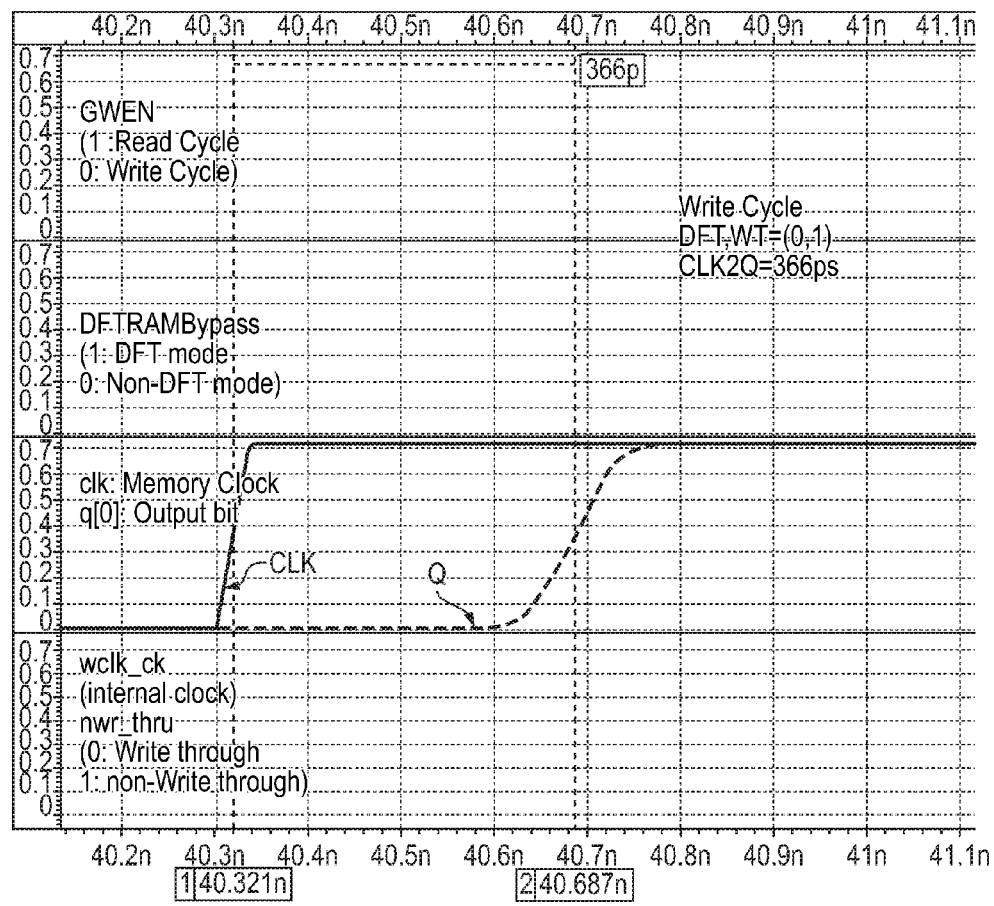
Figure 2C:
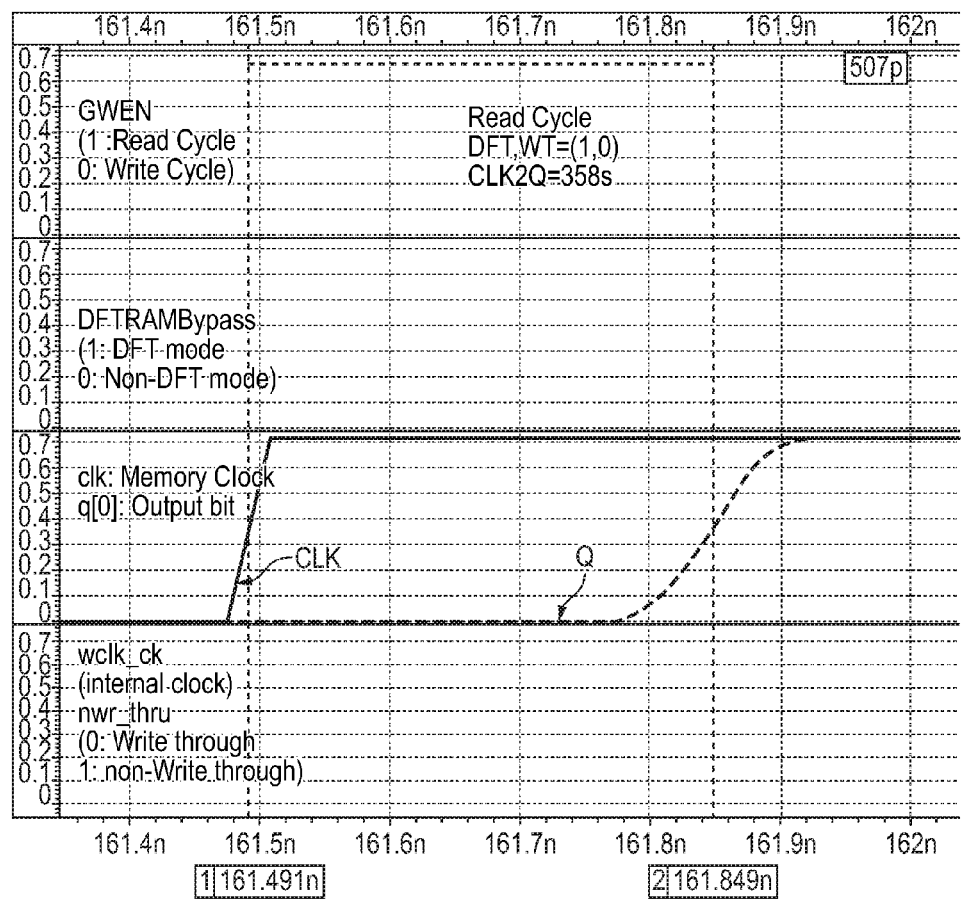
Figure 2D:
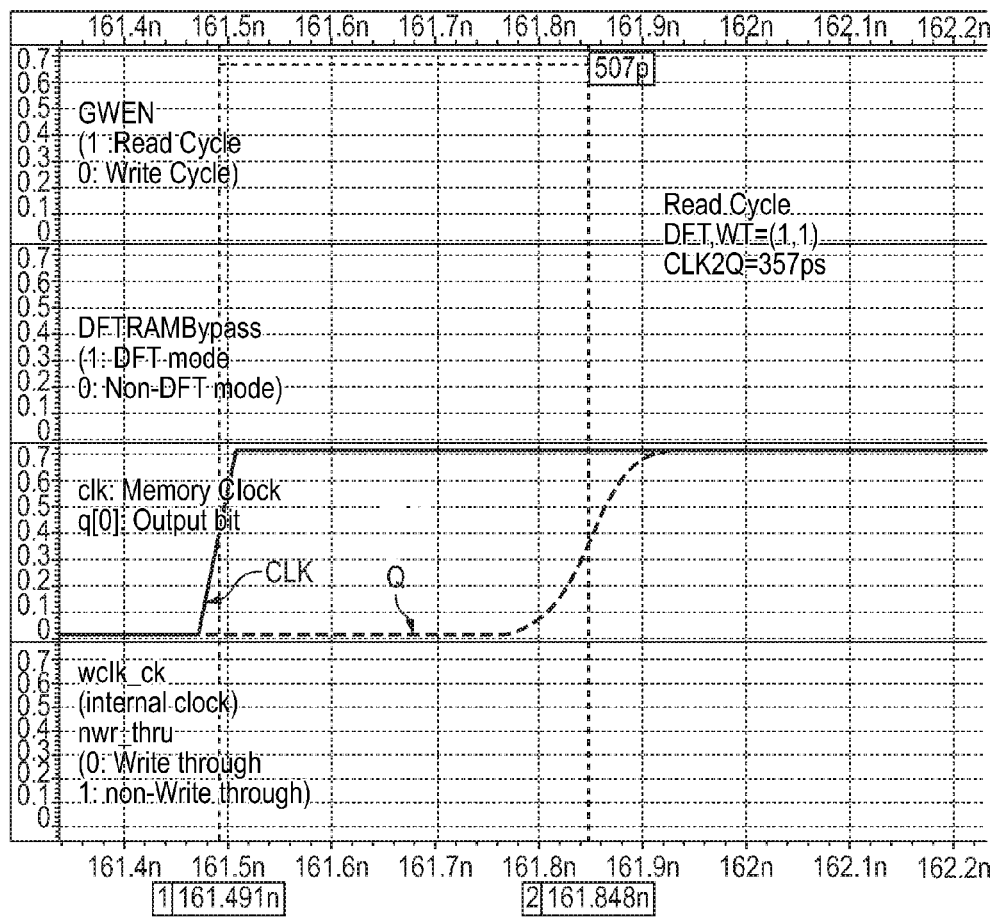

FIGS. 2A-D show example simulated timing diagrams that illustrate this discrepancy in CLK2Q between the two modes of operation (read mode and test mode) for the configuration shown in FIG. 1. FIG. 2A shows the timing when the memory device 100 is in a read mode of operation (neither DFT nor write-through being enabled), FIG. 2C shows the timing when the memory device is in a DFT mode of operation, FIG. 2B shows the timing when the memory device is in a write-through mode of operation and FIG. 2D shows the timing when the memory device is in both a write-through mode of operation and a DFT mode of operation. As previously explained, for convenience, FIGS. 2B-D may be referred to as representing the behaviour of the memory device 100 "in a test mode of operation".

In FIG. 2A, it is shown that when the memory device 100 is in a read mode of operation, the CLK2Q delay is 489 ps. Conversely, FIGS. 2B-D illustrate various versions of a test mode of operation where the CLK2Q delay is variously 366 ps, 358 ps, and 357 ps. Hence, it can be seen that the timing differs markedly depending on whether the circuitry is in a test mode of operation or a read mode of operation. Consequently, doubt may be cast on the reliability of test results occurring when operating in a test mode of operation.

Figure 3:
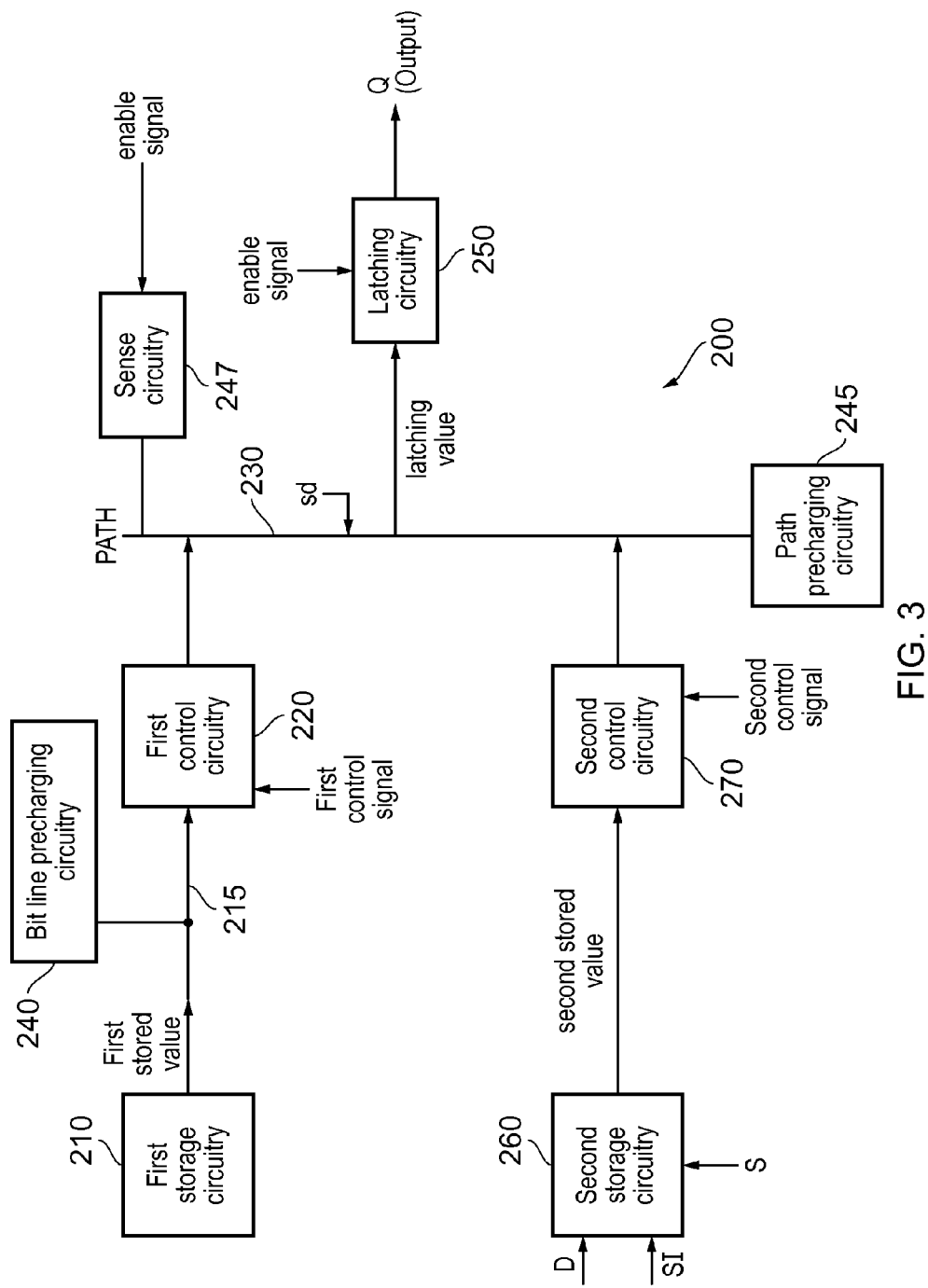
FIG. 3 shows, schematically, some components of a memory device in accordance with one embodiment.

FIG. 3 schematically illustrates a portion of a memory device 200 in accordance with one embodiment. First storage circuitry 210 is configured to provide a first stored value. The first storage circuitry 210 may, for example, be a bit cell that stores a single binary value as a bit. A bit line (bl) 215 is connected to the first storage circuitry 210. In a read mode of operation, the bit line 215 is precharged to a particular voltage by bit line pre-charging circuitry 240. In response to a first control signal, the first control circuitry 220 connects the bit line 215 to the path 230, which is precharged to the same value as the precharged bit line by path precharging circuitry 245. When the bit line 215 and path 230 have been precharged (and the precharge circuitry is then turned off), the first storage circuitry 210 outputs the first stored value to the bit line 215 such that the voltage of the bit line and therefore the path is made to change by the value output by the first storage circuitry. In response to an enable signal, sense circuitry 247 detects the voltage change on path 230 and outputs a sensed value sd along the path 230, which becomes the latching value that is received by the latching circuitry 250. The sensed value sd corresponds with the voltage change detected by the sense circuitry 247. In other words, the sense circuitry 247 helps to drive the voltage on the path 230 in the same direction as the voltage change that occurs. The latching circuitry 250 is configured to provide an output (Q) based on the latching value.

In a test mode of operation, second storage circuitry 260 is configured to provide a second stored value to control circuitry 270. The second storage circuitry 260 may, for example, be a DFT latch. The second storage circuitry 260 receives a data value (D) that is used for testing using DFT techniques and a scan input signal (SI) together with a scan mode signal (S) that indicates whether the output from the second storage circuitry 260 should correspond to signal D or SI. The second control circuitry 270 controls the output of a latching value to the path 230. The latching value is based on the value of the second stored value output from the second storage circuitry 260. The control circuitry 270 may receive a second control signal that determines when the output is to be produced by the control circuitry 270. As described above, the latching value is provided to the latching circuitry 250 which provides an output (Q) in dependence on the enable signal.

Accordingly, it can be seen that regardless of the mode of operation in which the memory device 200 operates, the enable signal is used to control the output of a value at Q. Consequently, the delay between the clock and the output of a value is very similar in both modes of operation. The results of applying DFT techniques should, therefore, be more reliable since the use of the same signal (the enable signal) to control the timing at the output provides that a data value will become available after a period of time following a clock edge that differs very little between the two modes of operation.

In this example embodiment the path 230 can be considered to be a dynamic node. In other words, the path 230 may be a node with a pre-charge phase, in which the node is precharged to a known value (such as VDD) and an evaluation phase, in which the voltage of the node is evaluated to determine whether it is approximately still the known value or not.

Note that, in the embodiment shown in FIG. 3, the path precharging circuitry 245 is shown as a separate element. However, the path precharging circuitry 245 could also form part of the sense circuitry 247. Additionally, the circuitry shown in the embodiment of FIG. 3 shows only a single bit line 215 and a single path 230 in a single rail configuration. However, it will be appreciated that FIG. 3 is merely representative of a dual rail configuration.

Figure 4:
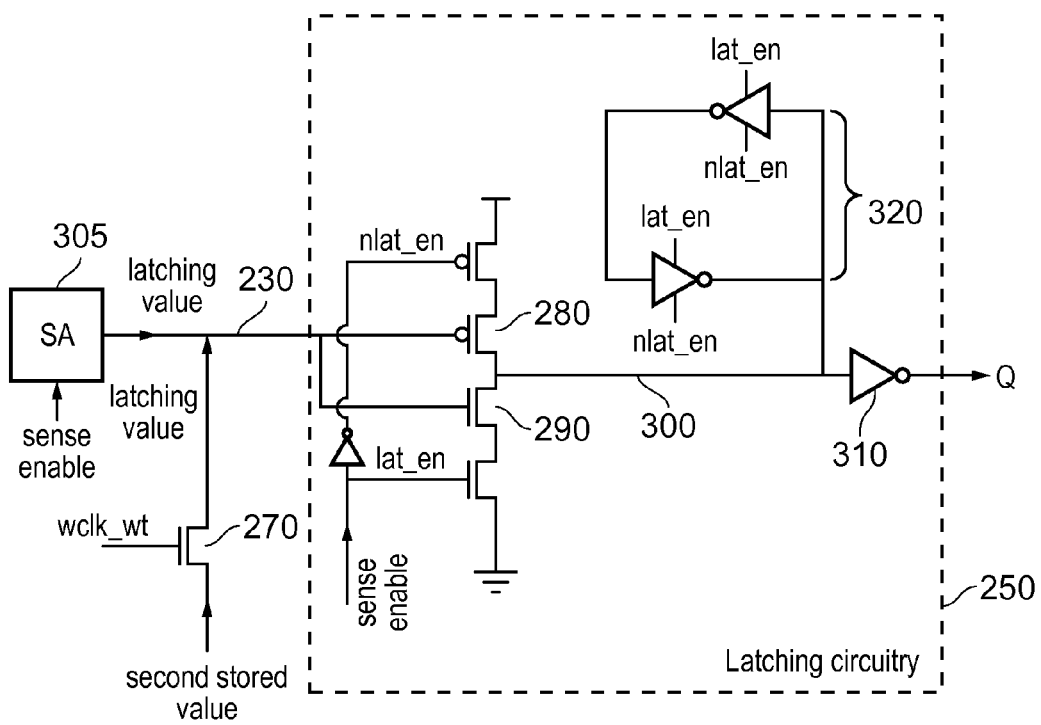
FIG. 4 shows in more detail the configuration of an example of part of the circuit shown schematically in FIG. 3.

FIG. 4 is a circuit diagram illustrating a part of the memory device 200 in accordance with one embodiment. In the embodiment shown in FIG. 4, the second control circuitry 270 is implemented using an NMOS transistor. In particular, the NMOS transistor is controlled according to signal wclk_wt, and causes a value to be provided to the path 230 that corresponds with the second stored value. The input from the second stored value is a "full rail signal", meaning the path will be either VDD or ground. The sense amp will fire when the enable is activated. However, since the signal is full rail, there is no amplification by the sense circuit, and the value remains the same as was put there by second control circuit.

In this embodiment, the sense circuitry is implemented by sense amplifier circuitry 305, controlled via a sense enable signal. The latching value output from the sense amplifier circuitry 305 or from the second control circuitry 270 is then provided to the gates of transistors 280 and 290. In dependence on a latch enable signal lat_en and its complement nlat_en, a value is output to the node 300 by pulling the node 300 either towards VDD or towards ground. The value is then stored in the latch 320. The latching 320 comprises a pair of inverters clocked via the signal lat_en. The inverter 310 compensates for the inversion in logical value of the signal that occurs at the transistors 280 and 290 when the latching value is transferred from the path 230 to the node 300.

The signal lat_en and its complement nlat_en are derivatives of the sense enable signal that is used to control the sense amplifier circuitry 220. Moreover, it can be seen that the same signal (sense enable, which produces the signal lat_en) is used to control the output of data regardless of whether the memory device 200 is in a test mode of operation or a read mode of operation. Since the sense enable signal is dependent on the clock signal CLK, data arrives at Q at a similar time after the assertion of a clock signal, regardless of the mode of operation. Hence the reliability of DFT techniques may be improved as compared to previously proposed approaches. Similarly, the time to remove a value at Q from a previous cycle (the de-access time) is consistent between the two modes of operation and, in fact, such a de-access time can not only be closely matched to the access time, but may also be increased compared to previously proposed techniques, without performance being impacted.

Figure 5:
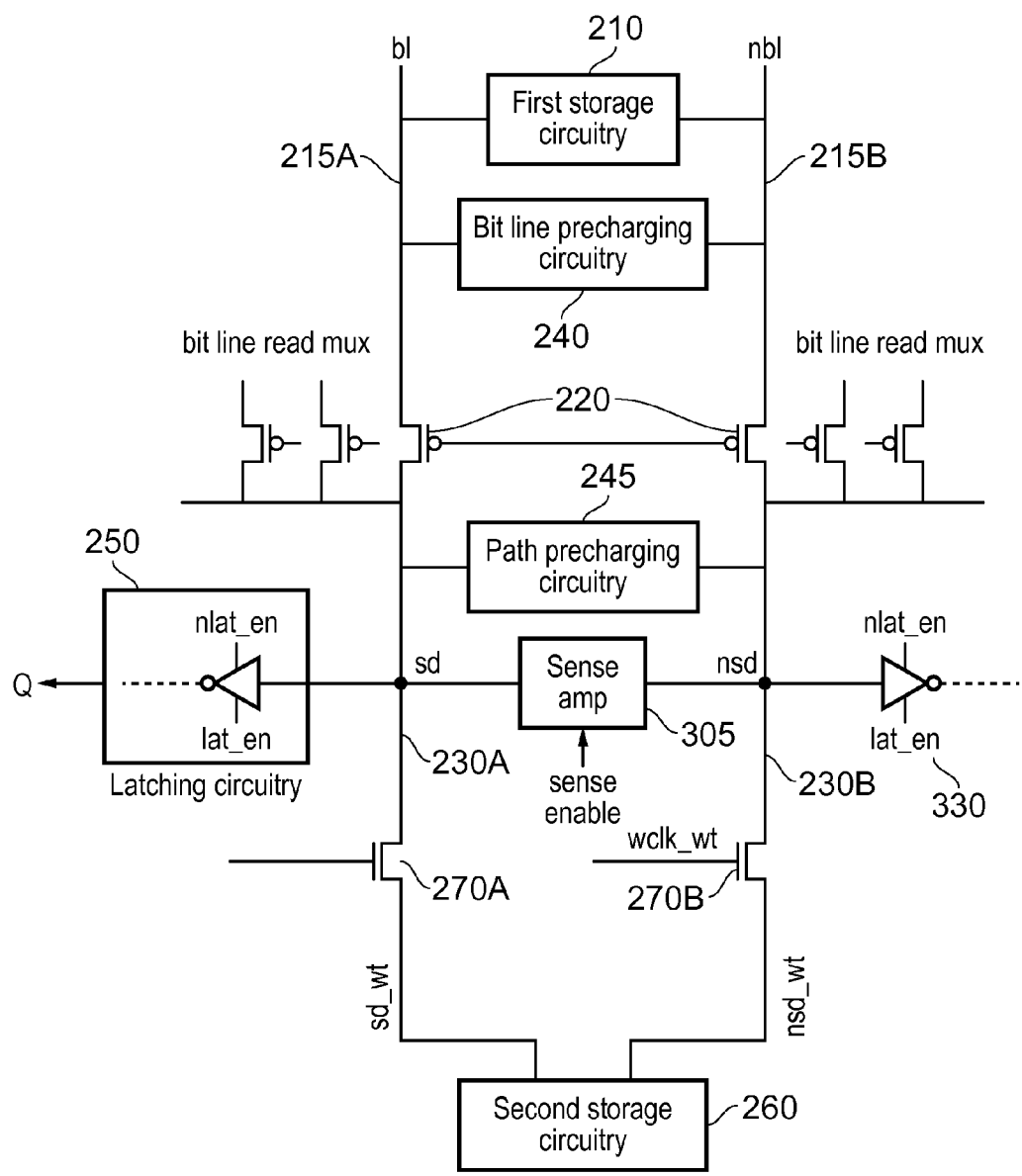
FIG. 5 illustrates the function of the sense amplifier circuitry in accordance with one embodiment.

FIG. 5 illustrates the operation in particular of the sense amplifier circuitry 220 in more detail. The embodiment shown in FIG. 5 uses similar reference numbers to those used in FIGS. 3 and 4. However, the embodiment shown in FIG. 5 shows a dual rail configuration. Accordingly, the suffixes "A" and "B" have been added to previously used reference numerals to refer to individual elements where a single element was previously shown.

In a read mode of operation, the bit line precharging circuitry 240 is configured to precharge the bit lines bl 215A and nbl 215B. Similarly, path precharging circuitry 245 is configured to precharge the paths 230A, 240B. The bit lines and paths are then allowed to float. The first storage circuitry 210 then outputs the first stored value and consequently the voltage on one of the bit lines 215A, 215B will change. There may be a number of different first circuitries, all with their own bit line pairs. Accordingly, first control circuitry 220 in the form of a bit line read mux is used to connect a bit line and its complement to the paths 230A, 230B. This selection may be made in dependence on a first control signal, as previously illustrated in FIG. 3, for example.

The change in voltage on paths 230A, 230B is detected by the sense amplifier circuitry 305. The sense amplifier circuitry 305 is configured to help pull the node sd towards VDD or VSS, in dependence on the voltage change that occurs on the paths 230A, 230B. The sense amplifier circuitry 305 drives the voltage on the path in the same direction as the voltage change. In other words, if the voltage on path 230A starts to drop, then the sense amplifier circuitry 305 will drive the voltage of the path 230A to ground. A value is then latched by latching circuitry 250. Note that the output from the sense amplifier circuitry 305 is single rail. That is, only a single output is sent to the latching circuitry 250. The inverter 330 is provided for loading purposes only to ensure that sd and nsd are subject to the same loads. Consequently, when the sense amplifier circuitry 305 compares sd and nsd to determine any voltage change, this comparison is performed accurately.

In a DFT mode of operation, the NMOS transistors (second control circuitry) 270A, 270B provide the second stored value from the second storage circuitry 260 as a latching value to the path 230A, 230B. The path precharging circuitry 245 precharges the path. After the path has been precharged and before the second stored value is applied to path through the second control circuitry, the path is then allowed to float. Accordingly, the latching value is not disturbed as a result of having to fight against the path precharging circuitry 245 that drives the voltage on the paths 230A, 230B. The bit lines 215A, 215B are disconnected from the paths 230A, 230B by the first control circuitry (i.e. the bit line read mux) 220. Hence, the bit line precharging circuitry 240 can be kept active without affecting the voltage of the paths 230A, 230B.

The write through mode of operation is similar to the DFT mode of operation. However, the bit lines 215A and 215B are connected to the paths 230A, 230B and the bit line precharging circuitry 240 is disabled. Accordingly, the latching value that originates from the second storage circuitry 260 is latched by the latching circuitry 250. Additionally, the change in voltage on the bit lines 215A, 215B causes the latching value to be stored by the first storage circuitry (e.g. a bitcell) 210.

FIG. 5 shows a dual rail configuration in which a sense enable signal is used. In a single rail configuration, the bit line may swing from VDD to VSS itself and so there would typically be no need for a sense enable signal. However, the latching circuitry in FIG. 5 needs an enable signal to control latching of values. One way of implementing a single rail variant of the embodiment shown in FIG. 5 is to create an enable signal via a "dummy path" that emulates the read time through a bit cell, a full swing bit line, and then through a control path. The latching circuitry 250 could then be enabled via the enable signal slightly earlier than when the read signal would arrive through node sd, so that the critical output delay would not be gated by the enable signal.

Figure 6:
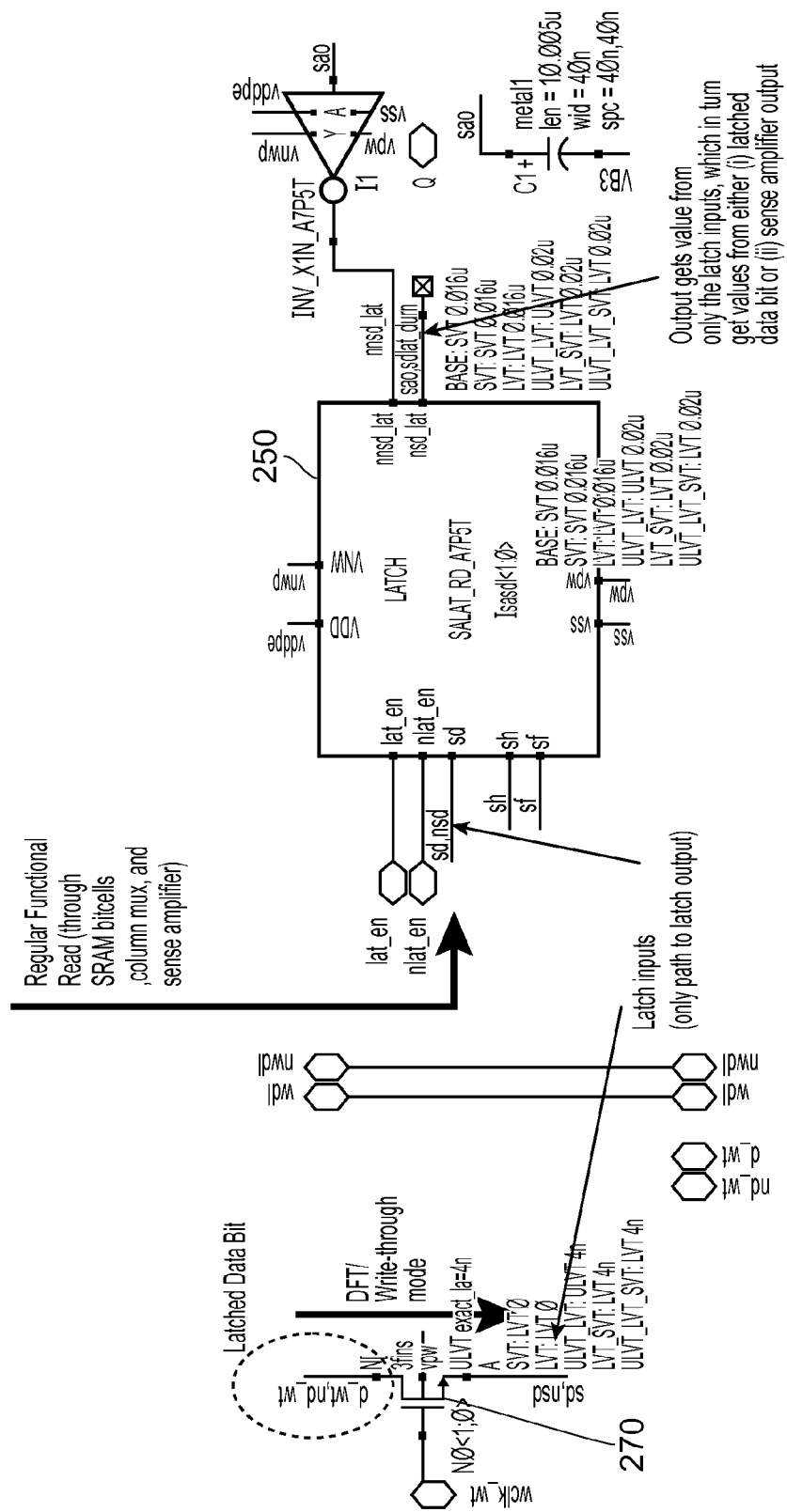
FIG. 6 is a schematic showing the configuration of an output (Q) latch in accordance with one embodiment.

FIG. 6 shows an example of the latching circuitry 250 in accordance with one embodiment. As shown in the embodiment of FIG. 6, second control circuitry 270—an NMOS transistor—is used to control the flow of a data value from the second storage circuitry 260 when the memory device 200 is in a test mode of operation. This data is provided to the latching circuitry 250. In a read mode of operation, data is provided from the first storage circuitry 210 to the latching circuitry 250. The latch itself is clocked by the lat_en signal and its complement nlat_en. Additionally, as shown in the embodiment of FIG. 6, the latching circuitry 250 is configured to output data that it receives to the output, Q.

FIGS. 7A-D show a simulated timing diagrams corresponding to the circuitry of one embodiment. In particular, the CLK2Q delay is shown.

Figure 7A:
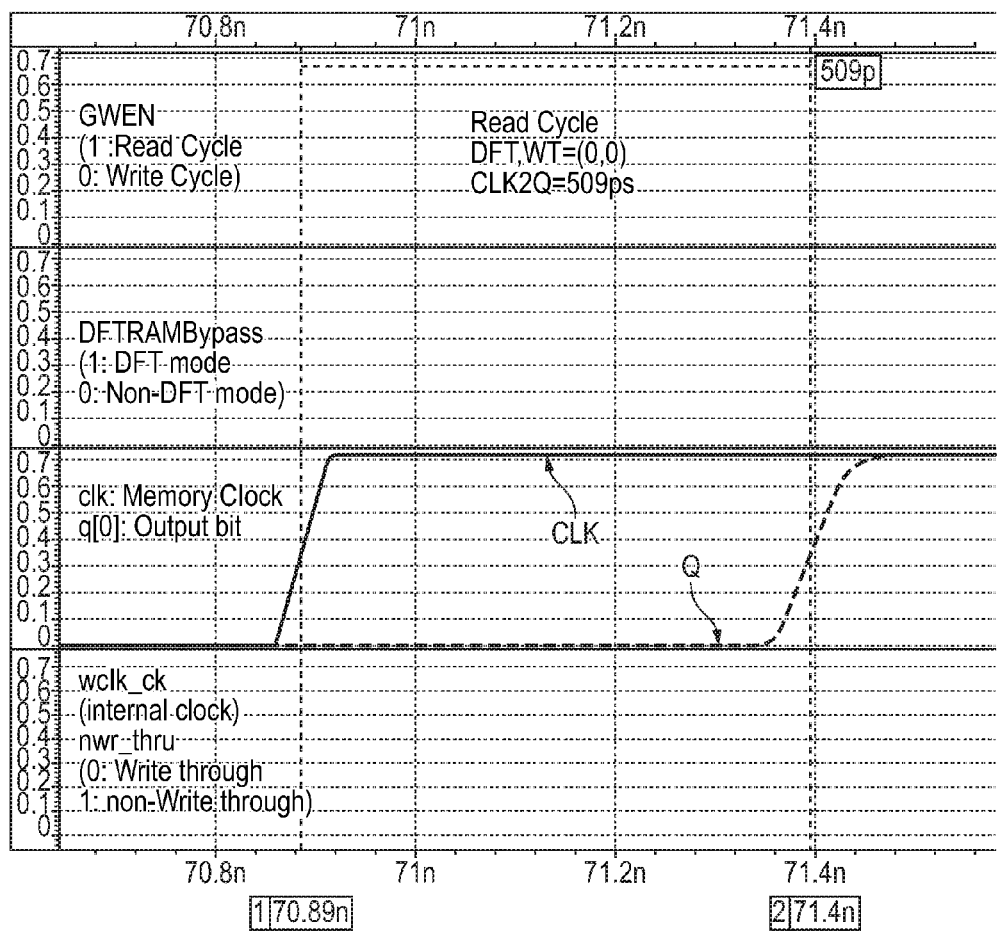
FIGS. 7A-D illustrate simulated timing diagrams showing example timing of various signals in the example circuits shown in FIGS. 5 and 6.
Figure 7B:
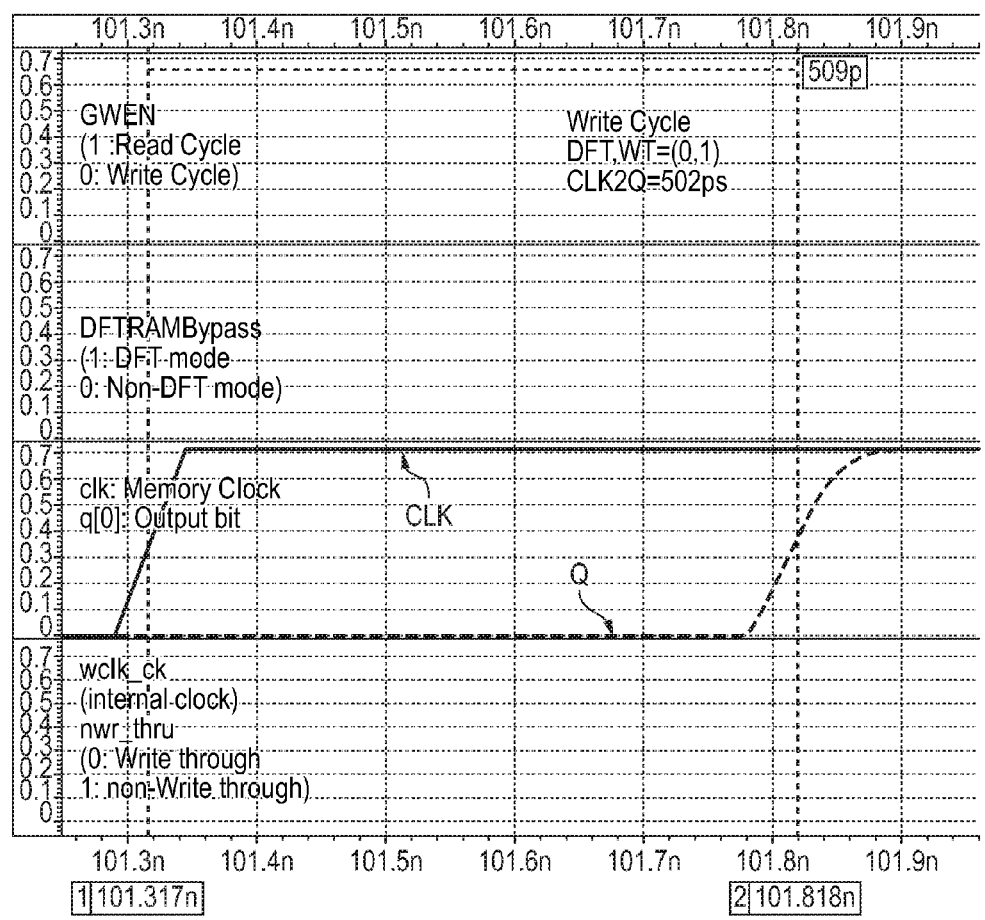
Figure 7C:
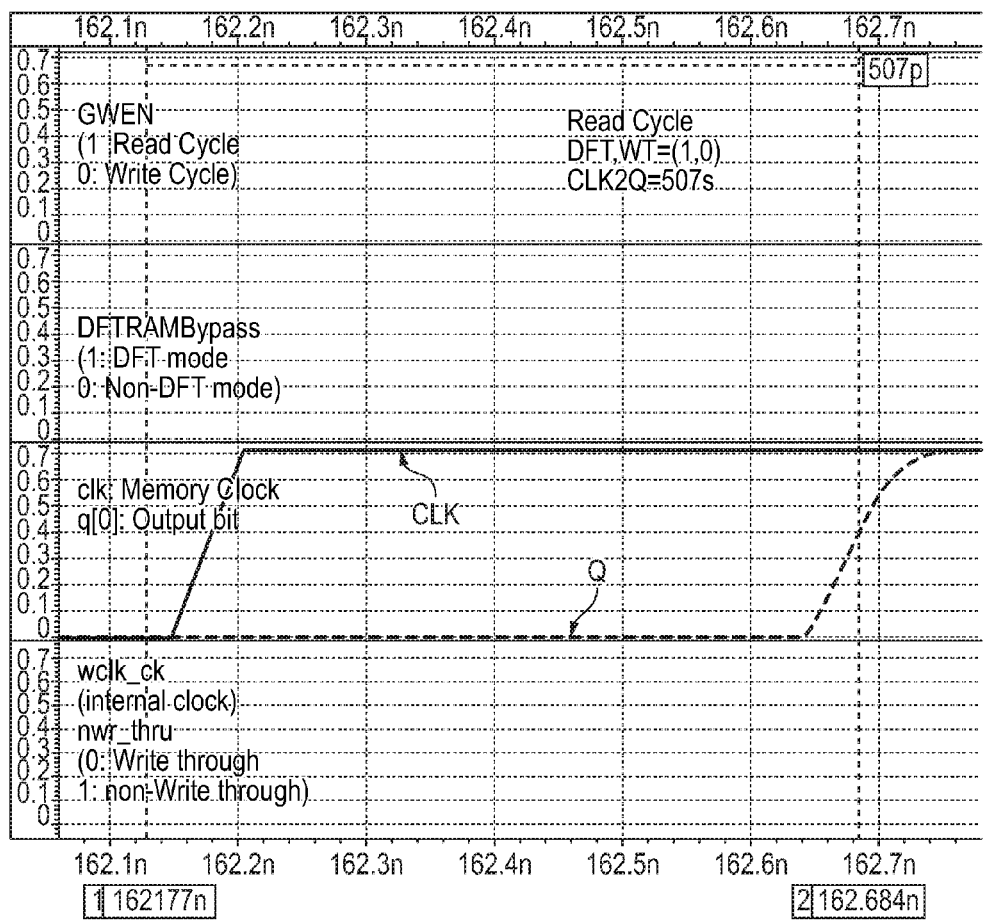
Figure 7D:
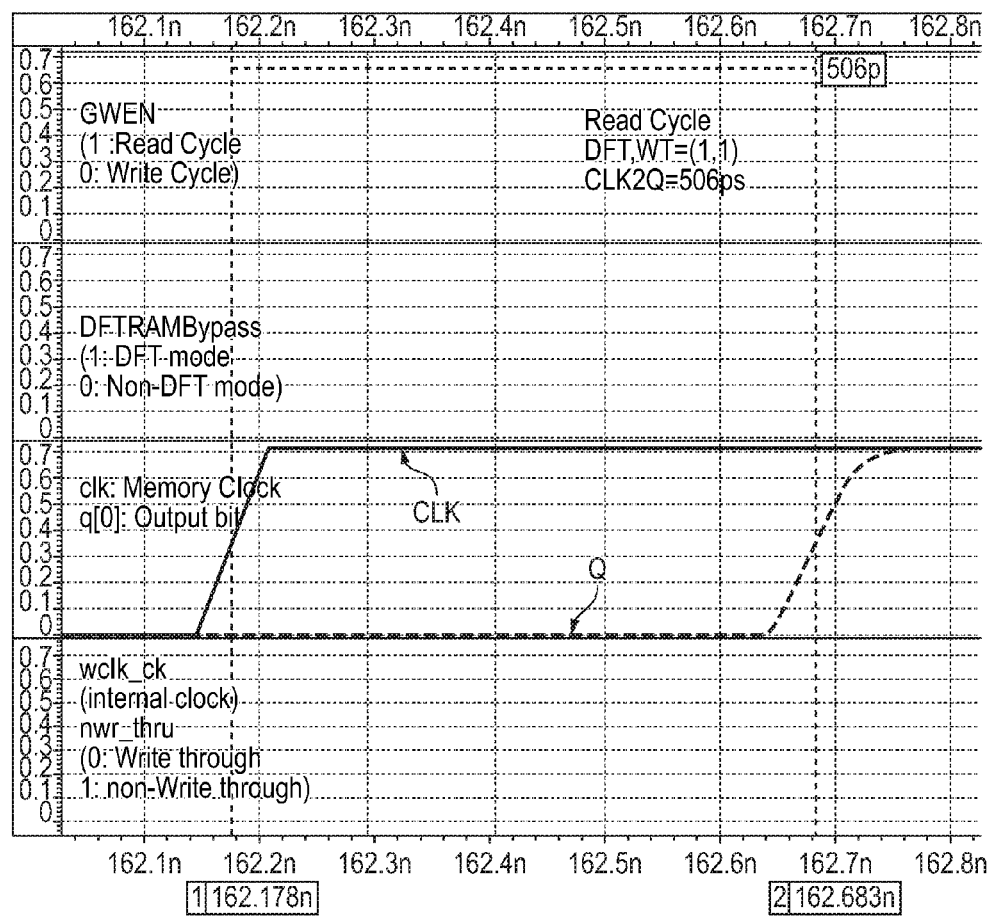

As in the case of FIGS. 2A-D, FIG. 7A corresponds to the use of a read mode of operation, FIG. 7C corresponds to the use of a DFT mode of operation, FIG. 7B corresponds with the use of a write-through mode of operation and FIG. 7D corresponds with the use of both write-through and DFT modes of operation. The diagrams illustrate that in each of the four modes, the CLK2Q delay is approximately the same. In particular, the CLK2Q delay ranges from 509 ps to 502 ps. Hence, it can be seen that as a result of using the circuitry in accordance with one embodiment, the CLK2Q delay can be made approximately the same for the memory device 200 regardless of the mode in which it operates. Consequently, the result of the DFT tests can be considered to be more reliable, since data is provided at Q a consistent period of time after the assertion of a clock signal. In this embodiment, the CLK2Q delay differs by approximately 1.5%. However, in other embodiments the difference may be 5% or 10%. Such differences may be attributed, for example, to the use of slightly different but functionally similar circuitry or components, together with manufacturing tolerances used in the circuitry and its components.

Figure 8:
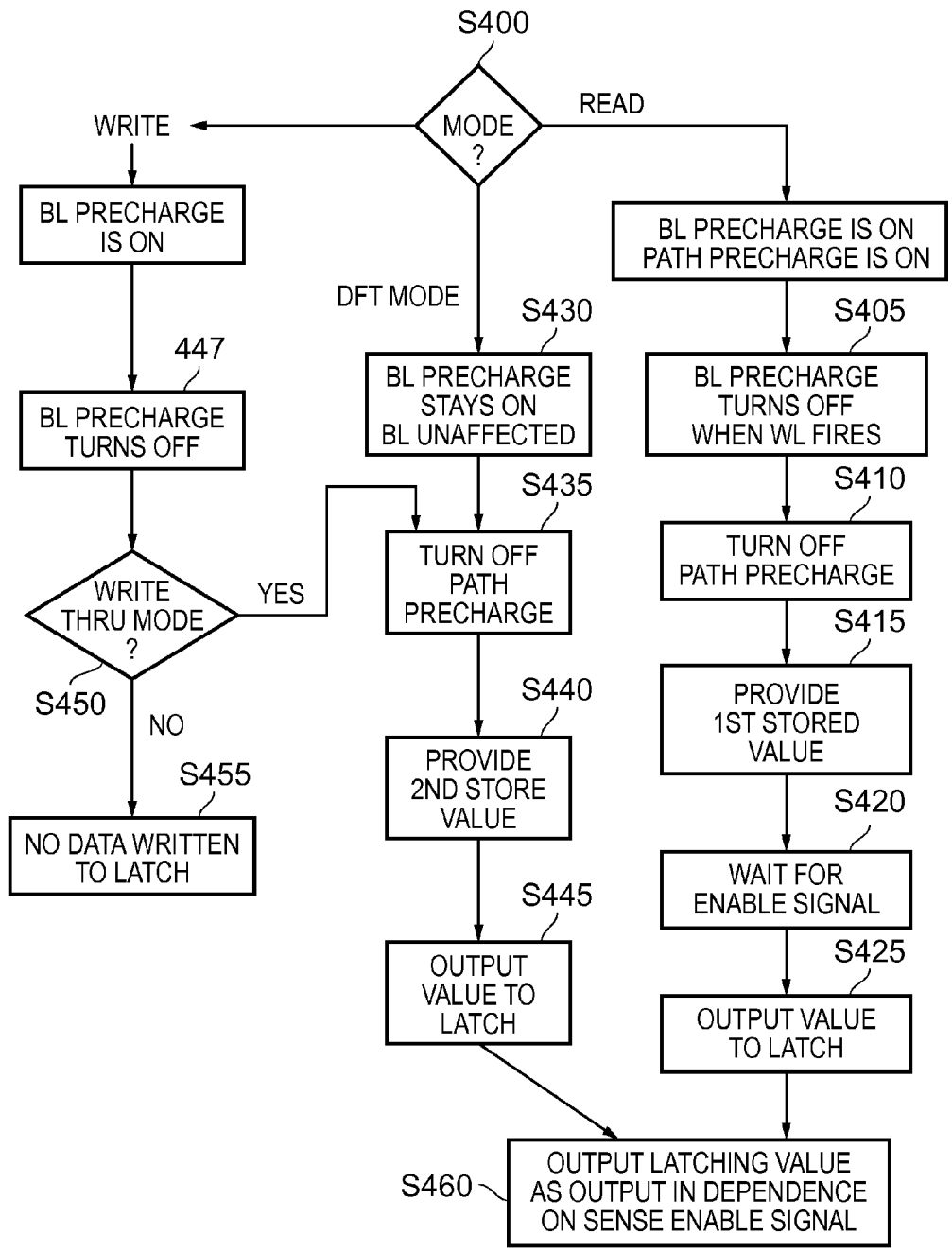
FIG. 8 is a flow chart illustrating a method of operating a memory device in accordance with one embodiment.

FIG. 8 shows a method of operating the memory device 200 in accordance with one embodiment. In this embodiment, the method begins at step S400, where it is determined which mode the memory device 200 is in. If the memory device 200 is in a read mode of operation, then the bitline precharging circuitry 240 and the path precharging circuitry 245 will be on. However, at step S405, when the word line fires, the bit line precharging circuitry 240 is disabled. Accordingly, the bit line 215 is left to float at its precharged voltage level. Next, at step S410, the path precharging circuitry 245 is disabled. Accordingly, the path 230 is left to float at voltages similar to those of the bit line 215. Flow then proceeds to step S415, in which the first stored value is provided. This may be provided, for example, from the first storage circuitry 210 by selectively connecting the first storage circuitry 210 to the bit line 215. Step S420 waits for the enable signal to be activated. Once that occurs, at step S425, a latching value is output to the latching circuitry 250 by the sense amplifier circuitry 305.

If at step S400 it is determined that the memory device 200 is in a DFT mode of operation, then at step S430, the bit line precharging circuitry 240 is kept on. The bit line 215 remains unaffected due to the bit line being disconnected from the path 230 as a consequence of the first control circuitry 220 (e.g. a bit line read mux).

At step S435, the path precharging circuitry 245 is disabled and then at step S440, the second stored value is provided to the path 230. This may occur, for example, via a second storage circuitry 260 and via second control circuitry 270. Then, at step S445, the second stored value may be output to the latching circuitry 250.

If at step S400 it is determined that the memory device 200 is in a write mode of operation, then the bit line precharging circuitry 240 will be on. However, at step S447, the bitline precharging circuitry 240 is turned off. The bit line 215 and the path 230 are connected via first control circuitry 220. Step S450 determines whether or not the memory device 200 is in a write through mode of operation. If so, flow proceeds to step S435 where the path precharging circuitry is disabled, as previously discussed. In this case, the connection of the bit line 215 to the path 230 causes a value to be output to the latching circuitry 250 and also stored in the first storage circuitry 210. Alternatively, if at step S450, the memory device 200 is not in a write through mode of operation then at step S455, data is written to the first storage circuitry 210, but since a latch enable signal is not asserted, no data will be written to the latching circuitry 250.

In the read, DFT, and write-through modes, at step S460, a latching value is output from latching circuitry 250 in dependence on the enable signal. The latching circuitry 250 may therefore receive the data value originating from either the first storage circuitry 210 or the second storage circuitry 260, depending on the mode of the memory device 200, and then outputs a latching value when indicated by the enable signal. For example, when the enable signal is asserted, the latching circuitry 260 may output the received value.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

We claim:

1. A memory device comprising:
latching circuitry to receive a latching value and to provide said latching value as an output;
a path to receive said latching value and to pass said latching value to said latching circuitry;
first storage circuitry to provide a first stored value when said memory device is in a read mode of operation;
a bit line connected to said first storage circuitry;
first control circuitry to selectively connect said bit line to said path;
sensing circuitry to, when an enable signal is active, detect a voltage change on said path as a result of connecting said bit line to said first storage circuitry and said path, and to output said latching value on said path, wherein said latching value is dependent on said voltage change;
second storage circuitry to provide a second stored value when said memory device is in a test mode of operation; and
second control circuitry to receive said second stored value and to selectively output said second stored value as said latching value on said path,
wherein said latching circuitry is to output said latching value as said output in dependence on said enable signal, such that said enable signal controls both said latching circuitry and said sense circuitry.

2. The memory device as claimed in claim 1, wherein said memory device is capable of toggling said enable signal in said test mode of operation.

3. The memory device as claimed in claim 1, wherein said second control circuitry selectively outputs said second stored value when said memory device is in said test mode of operation.

4. The memory device as claimed in claim 1, wherein said first control circuitry is a bit line read multiplexer.

5. The memory device as claimed in claim 4, wherein said first control circuitry comprises a p-type transistor.

6. The memory device as claimed in claim 1, wherein said second control circuitry is a transistor.

7. The memory device according to claim 6, wherein said second control circuitry is an n-type transistor.

8. The memory device according to claim 1, wherein said first storage circuitry is a bit cell.

9. The memory device according to claim 1, wherein said second storage circuitry is a latch.

10. The memory device according to claim 9, wherein said second storage circuitry is configured to store a test value.

11. The memory device according to claim 1, wherein said second storage circuitry is configured to receive a data value, a scan input value and a scan signal; and
wherein said second storage circuitry is configured to select between said data value and said scan input value for outputting as said second stored value, based on a value of said scan signal.

12. A memory device according to claim 1, wherein said latching circuitry is configured to output said latching value when said enable signal is active.

13. A memory device according to claim 1, wherein a clock-to-output time in said test mode of operation is within 10% of said clock-to-output time in a read mode of operation.

14. A memory device according to claim 1, wherein a clock-to-output time in said test mode of operation is within 1.5% of said clock-to-output time in said read mode of operation.

15. A memory device according to claim 1, comprising:
path precharging circuitry to precharge said path when enabled,
wherein said sensing circuitry detects a voltage change on said path when said path is precharged and when said path precharging circuitry is disabled.

16. A memory device according to claim 1,
wherein the path comprises a dynamic node having an evaluation mode and a precharge mode.

17. A method of operating a memory device having a read mode of operation and a test mode of operation, said method comprising the steps:
in said read mode of operation:
providing a first stored value to a bit line; and
when said bit line has been selectively connected to a path, in response to an enable signal, detecting a voltage change on said path and outputting a latching value on said path, wherein said latching value is dependent on said voltage change;
in said test mode of operation:
providing a second stored value; and
selectively outputting said second stored value as said latching value on said path;
in both modes of operation:
outputting said latching value as an output in dependence on said enable signal, such that said enable signal controls both said step of detecting a voltage change on said path and said step of outputting said latching value as an output.

18. A memory device comprising:
latching means for receiving a latching value and for providing said latching value as an output;
path means for receiving said latching value and for passing said latching value to said latching means;
first storage means for providing a first stored value when said memory device is in a read mode of operation;
bit line means for connecting to said first storage means;
first control means for selectively connecting said bit line to said path means;
sense means for, when an enable signal is active, detecting a voltage change on said path means as a result of connecting said bit line means to said first storage means and said path and for outputting a voltage on said path to said latching value, wherein said latching value is dependent on said voltage change;
second storage means for providing a second stored value when said memory device is in a test mode of operation; and
second control means for receiving said second stored value and for selectively outputting said second stored value as said latching means on said path means,
wherein said latching means is for outputting said latching value as said output in dependence on said enable signal, such that said enable signal controls both said latching circuitry and said sense circuitry.

\* \* \* \* \*